(12) United States Patent
Lim et al.

(10) Patent No.: US 11,961,671 B2
(45) Date of Patent: Apr. 16, 2024

(54) METHOD FOR MANUFACTURING HIGH-K MIM CAPACITOR TO IMPROVE ELECTRICAL CHARACTERISTICS

(71) Applicant: Elohim Incorporation, Daejeon (KR)

(72) Inventors: Seunggu Lim, Gyeonggi-do (KR); Jihoon Cha, Seoul (KR); Dong-Ki Lee, Incheon (KR); Taedong Kim, Gyeonggi-do (KR); Yeonglyeol Park, Gyeonggi-do (KR)

(73) Assignee: Elohim Incorporation, Daejeon (KR)

( * ) Notice: Subject to any disclaimer, the term of this patent is extended or adjusted under 35 U.S.C. 154(b) by 90 days.

(21) Appl. No.: 17/584,085

(22) Filed: Jan. 25, 2022

(65) Prior Publication Data

US 2022/0392702 A1    Dec. 8, 2022

(30) Foreign Application Priority Data

| Jun. 8, 2021 | (KR) | .......... 10-2021-0074389 |
| Jun. 8, 2021 | (KR) | .......... 10-2021-0074398 |
| Nov. 4, 2021 | (KR) | .......... 10-2021-0150621 |
| Nov. 22, 2021 | (KR) | .......... 10-2021-0161450 |

(51) Int. Cl.
   *H01G 4/008*   (2006.01)
   *H01G 4/12*    (2006.01)
   *H01L 49/02*   (2006.01)

(52) U.S. Cl.
   CPC .............. *H01G 4/008* (2013.01); *H01G 4/12* (2013.01); *H01G 4/1236* (2013.01); *H01L 28/75* (2013.01)

(58) Field of Classification Search
   CPC ......... H01G 4/008; H01G 4/12; H01G 4/1236
   See application file for complete search history.

(56) References Cited

U.S. PATENT DOCUMENTS

| 2002/0195643 A1* | 12/2002 | Harada | ................ H01L 29/516 257/E29.164 |
| 2010/0044806 A1* | 2/2010 | Hou | ..................... H01L 29/517 257/412 |
| 2020/0105633 A1* | 4/2020 | Lee | ........................ H01L 23/291 |

FOREIGN PATENT DOCUMENTS

| JP | 2019192862 A | 10/2019 |
| KR | 100990615 B1 | 10/2010 |
| KR | 20200036600 A | 4/2020 |

OTHER PUBLICATIONS

Bae, et al, "Electrical and Material Characteristics of HfO2 Film in HfO2/Hf/Si MOS Structure," Journal of the Korean Institute of Electrical and Electronic Material Engineers, vol. 22, No. 2, Feb. 2009, 6 pages.

Office Action (Request for the Submission of an Opinion), App. No. KR10-2021-0161450, dated May 17, 2023, 10 pages.

(Continued)

*Primary Examiner* — Nathan Milakovich
(74) *Attorney, Agent, or Firm* — Berkeley Law & Technology Group, LLP

(57) ABSTRACT

An embodiment of the present disclosure provides a MIM capacitor by High-k dielectric and method for fabricating the same to prevent formation of oxygen-based interface films between a lower electrode and a dielectric layer, and between an upper electrode and a dielectric layer by stacking a first film formed of metal between the dielectric layer formed of a High-k material having a high dielectric constant and the lower electrode formed of metal, and a second film formed of metal between the dielectric layer and the upper electrode.

19 Claims, 9 Drawing Sheets

(56) References Cited

OTHER PUBLICATIONS

Bae, et al, "Electrical and Material Characteristics of HfO2 Film in HfO2/Hf/Si MOS Structure," Journal of the Korean Institute of Electrical and Electronic Material Engineers, vol. 22, No. 2, p. 101, Feb. 2009, 6 pages.
Pantisano, et al, "Towards barrier height modulation in HfO2/TiN by oxygen scavenging—Dielectric defects or metal induced gap states?," Elsevier, Microelectronic Engineering, vol. 88, Issue 7, Jul. 2011, pp. 1251-1254.
Office Action, Shipping No. KR 9-5-2023-111409614, dated Dec. 11, 2023, 9 pages.
Office Action, Shipping No. KR 9-5-2023-116622199, dated Dec. 28, 2023, 15 pages.

\* cited by examiner

METHOD FOR MANUFACTURING HIGH-K MIM CAPACITOR TO IMPROVE ELECTRICAL CHARACTERISTICS

CROSS-REFERENCE TO RELATED APPLICATIONS

The present application claims priority under 35 U.S.C 119(a) to Korean Patent Applications No. 10-2021-0074389 filed on Jun. 8, 2021, 10-2021-0074398 filed on Jun. 8, 2021, 10-2021-0150621 filed on Nov. 4, 2021 and 10-2021-0161450 filed on Nov. 22, 2021 which are incorporated herein by reference in its entirety.

BACKGROUND

1. Technical Field

The present disclosure relates to a MIM capacitor by a High-K dielectric and a method for fabricating the same, and more particularly, to a MIM capacitor by a High-K dielectric and a method for fabricating the same for controlling a film reaction between a dielectric layer implemented with a High-K material and an electrode.

In addition, the present disclosure relates to a multilayer silicon capacitor and a method for fabricating the same, and more particularly, to a multilayer silicon capacitor formed by stacking multiple dielectric layers and a method for fabricating the same to improve high-frequency and/or ultrahigh frequency characteristics.

The present invention resulted from "Ultra-small, high-capacity smart passive device for 5G Mobile" of "Initial Startup Package Project" supported by the Ministry of SMEs and Startups (Project No.: 10429536)

2. Related Art

The contents to be described below are only provided for the purpose of providing background information related to an embodiment of the present disclosure, and the contents to be described do not naturally constitute the prior art.

Recently, high-performance (high clock speed and high energy consumption) SOC chips (System-on-Chip) are used in applications such as smartphones, artificial intelligence, autonomous vehicles, and the Internet of Things, and development of technology to reduce power noise and switching noise is required in high-frequency bands (frequency band of hundreds of MHz).

A capacitor is a device that stores energy in a form of electric charge, in a case of a DC power supply, charge is accumulated but no current flows, and in a case of an AC power supply, it has a characteristic of allowing a current to flow in proportion to a change in voltage over time and a capacitance of a capacitor while charging and discharging.

As an essential passive device used for various purposes, such as coupling & decoupling, filter, impedance matching, and charge pump, and demodulation in electric/electronic circuits such as digital circuits, analog circuits, and high-frequency circuits using these characteristics of the capacitor, it has been generally fabricated in various forms such as a chip and a disk, and mounted on a surface of a printed circuit board to be used.

However, with the miniaturization and complexity of electronic devices, an area where the passive devices may be mounted on the printed circuit board becomes smaller. As the frequency increases according to a high speed of the electronic devices, a parasitic impedance caused by various factors such as a conductor and solder between the passive device and the IC generates various problems. Therefore, in order to solve such problems, various attempts to embed the capacitor inside the printed circuit board are being actively carried out centering on printed circuit board makers and electronic and electronic component makers.

In particular, in a case of a capacitor implemented with silicon, it is downsized compared to a conventional multi-layer silicon capacitor, and the use of a thin capacitor is increasing.

The capacitor used in the downsized and thin capacitor must be implemented with a high-capacitance capacitor even though it is thin and small in size while being implemented in miniaturization and thinness. For this, a dielectric layer, which is a High-K material, may be used when fabricating the capacitor. However, the dielectric layer, which is the High-K material, has limitations in that the capacitor capacitance and voltage efficiency are lowered at high frequency and/or ultrahigh frequency.

In addition, in order for the capacitor to increase the charge storage efficiency, it is necessary to increase a dielectric constant and an area of the capacitor or decrease a thickness of the dielectric.

However, in a case where the area is increased by microprocessing, there is a limitation that the length and the width may be increased to maximize the storage capacitance. In order to overcome such a limitation, the thickness of the dielectric may be reduced, and then there is a limitation that a leakage current increase occurs.

To this end, the capacitor may be fabricated from a High-K material having a high dielectric constant. In a case where the capacitor is fabricated by using such a High-K material, there is a limitation in that a change in the dielectric characteristics in the high-frequency and/or ultrahigh-frequency region occurs.

That is, hafnium oxide (HfO2), zirconium dioxide, or the like may be used as a usual High-K material. When hafnium oxide is used, it may be combined with Poly-Si during the fabrication process in the case of Poly-Si electrode capacitor, and when combined, SiO2 interface layer may be generated between them. As the resulting dielectric constant of the capacitor is reduced by the generated SiO2 layer, there is a limitation in that the electrical characteristics of the capacitor are deteriorated.

Therefore, there is a demand for a capacitor that may be implemented with a high-capacitance capacitor even with a thin and small size, and may minimize a change in the characteristics even at the high frequency and/or the ultra-high frequency.

In addition, such a capacitor is an important passive device with enhanced energy storage capability. Efforts are being made to solve the above problems through the development of an on-chip MOS capacitor, a MIM capacitor, a deep trench capacitor, a land-side capacitor (LSC) applicable to single package, and the like.

Among capacitors, in particular, a three-dimensional High-K MIM capacitor has an effect of increasing the capacitance of the capacitor due to the High-K material characteristics of the dielectric layer and a three-dimensional trench structure compared to other types of capacitors in the same cross-sectional area. In addition, the three-dimensional High-K MIM capacitor implemented with a metal electrode has an effect that the resistance may be reduced by using it, so that it has an advantage for use in the high-frequency region. However, there is a limitation in that a capacitor product satisfying the sufficient capacitance and characteristics required by the industry have not been commercialized yet.

In addition, in the deposition processes of MIM layers with High-K material as a dielectric or in the subsequent heat-involving processes after that, there is a limitation in that an oxide-based non-uniform interfacial layer is generated between upper/lower electrodes and the dielectric layer which is located between upper and lower electrodes due to the thermal processes.

Due to the interfacial layer generated in this way, there is a problem that the capacitance of the MIM capacitor may decrease or the variance may increase. In addition, there is a limitation in that the resulting interfacial layer generates energy levels that trap charges at the interface, thereby increasing the leakage current during the capacitor operation.

The above-mentioned background art is technical information possessed by the inventor for derivation of the present disclosure or acquired in the process of derivation of the present disclosure, and cannot necessarily be said to be a known technology disclosed to the general public prior to the filing of the present disclosure.

SUMMARY

An object of the present disclosure is to provide a MIM capacitor by High-K in which a dielectric layer is implemented with a High-K material and a method for fabricating the same in order to overcome the above-described limitations.

In addition, another object of the present disclosure is to provide a MIM capacitor by a High-K dielectric and a method for fabricating the same capable of preventing generation of a non-uniform interfacial layer between upper/lower electrodes, and a dielectric layer in a process of fabricating a MIM capacitor including a dielectric layer implemented with a High-K material or a heat treatment process occurring during subsequent processes.

In addition, another object of the present disclosure is to provide a multilayer capacitor in which a High-K material with relatively higher dielectric constant and a dielectric layer or a High-K material with a relatively lower dielectric constant than the higher-K dielectric material are mixed to minimize a change in characteristics of a material in high-frequency and/or ultrahigh frequency regions, and a method for fabricating the same.

The objects of the present disclosure are not limited to the above-mentioned problems, and other objects and advantages of the present disclosure that are not mentioned may be understood by the following description, and will be more clearly understood by the embodiments of the present disclosure. It will also be appreciated that the objects and advantages of the present disclosure may be realized by the means and combinations thereof indicated in the claims.

According to an embodiment of the present disclosure, there is provided a MIM (metal insulator metal) capacitor including: a lower electrode formed of metal; a first film deposited on the lower electrode; a dielectric layer deposited on the first film; a second film deposited on the dielectric layer; and an upper electrode formed of metal on the second film. The first film and the second film may be formed by being deposited with any one of a film formed of a metal component of the dielectric layer and a film capable of combining with a component of the dielectric layer when the lower electrode and the upper electrode are deposited.

According to an embodiment of the present disclosure, the first film and the second film may be any one of Hafnium (Hf) and zirconium (Zr).

According to an embodiment of the present disclosure, the dielectric layer may be a High-K dielectric implemented with any one of hafnium oxide (HfO2) and zirconium dioxide (ZrO2).

According to an embodiment of the present disclosure, the first film and the second film may be formed of a plurality of layers.

According to an embodiment of the present disclosure, a thickness of the first film and a thickness of the second film may each be formed of 0.3 nm to 0.8 nm.

According to an embodiment of the present disclosure, the lower electrode and the upper electrode are formed of a conductive material and are deposited by any one of physical vapor deposition (PVD), chemical vapor deposition (CVD), and atomic layer deposition (ALD).

According to an embodiment of the present disclosure, there is provided a method for fabricating a MIM capacitor, including: depositing a lower electrode formed of metal; depositing a first film on the lower electrode; depositing a dielectric layer on the first film; depositing a second film on the dielectric layer; and depositing an upper electrode formed of metal on the second film.

In this case, the first film and the second film may be deposited with any one of a film formed of a metal component of the dielectric layer and a dielectric layer film formed with metal-rich material.

In addition, according to an embodiment of the present disclosure, there is provided a stacked silicon capacitor including: a first electrode; a second electrode; a dielectric layer formed of a first dielectric layer and a second dielectric layer disposed between the first electrode and the second electrode, and formed of a silicon dielectric material. A dielectric constant of the first dielectric layer may be formed to be greater than a dielectric constant of the second dielectric layer.

According to an embodiment of the present disclosure, the first dielectric layer may be any one of hafnium oxide (HfO2) and zirconium dioxide (ZrO2).

According to an embodiment of the present disclosure, a thickness of the first dielectric layer may be greater than a thickness of the second dielectric layer.

According to an embodiment of the present disclosure, the first dielectric layer may be formed at a thickness of 5 nm to 6 nm, the second dielectric layer may be formed at a thickness of 1 nm to 3 nm.

According to an embodiment of the present disclosure, an overall thickness of the stacked dielectric layers may be formed to be 18 nm to 20 nm.

According to an embodiment of the present disclosure, the first dielectric layer may be disposed to be in contact with one surface of any one electrode of the first electrode and the second electrode.

According to an embodiment of the present disclosure, the first dielectric layer may be disposed to be in contact with each one surface of the first electrode and the second electrode at the same time.

According to an embodiment of the present disclosure, there is provided a method for fabricating a stacked silicon capacitor, including: forming a first electrode; forming a first dielectric layer on the first electrode; stacking a second dielectric layer having a different dielectric constant from that of the first dielectric layer on the first dielectric layer; and forming a second electrode on the second dielectric layer.

In this case, a dielectric constant of the first dielectric layer may be greater than a dielectric constant of the second dielectric layer.

According to an embodiment of the present disclosure, when stacking the second electrode, the second dielectric layer may be stacked on the first dielectric layer at a thickness smaller than that of the first dielectric layer.

According to an embodiment of the present disclosure, the first dielectric layer may be stacked on the second dielectric layer after stacking the second dielectric layer.

Other aspects, characteristics, and advantages other than those described above will become apparent from the following drawings, claims, and detailed description.

The MIM capacitor of the embodiment of the present disclosure may maximize the performance of the capacitor by using the dielectric layer formed of the High-K material having a large dielectric constant. As the dielectric layer is formed of the High-K oxide material, an oxygen-based film may be formed between the lower electrode/the upper electrode of the metal component, and the dielectric layer. To prevent this, the first film and second film are deposited between the lower electrode and the dielectric layer, and between the dielectric layer and the upper electrode. The oxygen component of the dielectric layer and the metal component of the lower electrode and the upper electrode are combined by the deposited first and second layers to prevent formation of an oxygen-based film between the lower electrode and the dielectric layer, and between the dielectric layer and the upper electrode.

That is, the film deposited as a plurality of layers blocks contact between the dielectric layer and the lower electrode/ the upper electrode to prevent the generation of an oxide-based intermediate interface between the dielectric layer and the electrode.

In addition, it is possible to reduce capacitor capacitance variance and prevent generation of leakage current. In other words, it is possible to prevents the generation of an oxygen-based non-uniform interfacial layer between the dielectric layer of the High-K material and the electrode even during a thermal process when fabricating the MIM capacitor, thereby preventing deterioration of the performance of the capacitor.

The capacitor according to the embodiment of the present disclosure may form the dielectric layer in which the first dielectric layer and the second dielectric layer having different dielectric constants are multi-layered.

Specifically, the first dielectric layer may be formed of the High-K material which has a relatively higher dielectric constant, and the second dielectric layer may be formed of a material (dielectric material or High-K material) having a lower dielectric constant than that of the first dielectric layer. Accordingly, when the capacitor is fabricated, the dielectric layer, which is the High-K material, is used, and thus charge storage efficiency may be increased.

In addition, as the second dielectric layer uses a material having a dielectric constant lower than that of the first dielectric layer to form the dielectric layer, a change in electrical characteristics of the device at ultrahigh frequency may be minimized.

That is, as the dielectric layer is formed by mixing a material having a low dielectric constant that has little influence on the high frequency and/or the ultrahigh frequency, it is possible to minimize the change in characteristics of the dielectric layer even at the high frequency and/or the ultrahigh frequency.

Effects of the present disclosure are not limited to those mentioned above, and other effects not mentioned will be clearly understood by those skilled in the art from the following description.

BRIEF DESCRIPTION OF THE DRAWINGS

Various embodiments of the present disclosure will become more apparent in view of the attached drawings and accompanying detailed description, in which.

DETAILED DESCRIPTION OF THE EMBODIMENTS

Figure 1:
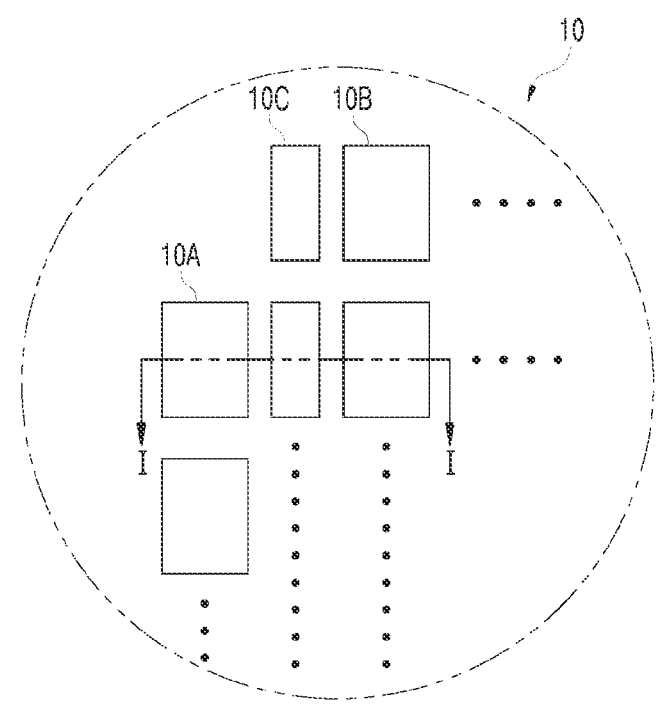
FIG. 1 is a view illustrating a MIM capacitor according to an embodiment of the present disclosure.

Hereinafter, embodiments of the present disclosure will be described in detail with reference to the accompanying drawings, and the same or similar components are given the same reference numerals, and redundant description thereof will be omitted. The suffixes "module" and "portion" for the components used in the following description are given or mixed in consideration of only the ease of writing the specification, and do not have distinct meanings or roles by themselves. In addition, when it is determined that a detailed description of a related known technology may obscure the gist of the embodiment invented in the present specification in describing the embodiments disclosed herein, the detailed description thereof will be omitted. In addition, the accompanying drawings are only for making it easy to understand the embodiments invented in the present specification, and the technical idea invented in the present specification is not limited by the accompanying drawings, is included in the spirit and scope of the present disclosure, and is to be understood as including all modifications, equivalents, and substitutions.

Terms including an ordinal number, such as first and second, may be used to describe various elements, but the elements are not limited by the terms. The above terms are used only for the purpose of distinguishing one component from another.

When a component is referred to as being "connected" or "coupled" to another component, it should be understood that it may be directly connected or coupled to the other component, but it is understood that another component may exist therebetween. On the other hand, when it is mentioned that a certain element is "directly connected" or "directly coupled" to another element, it should be understood that no other element is present in the middle.

A singular expression includes a plural expression unless the context clearly dictates otherwise.

In the present application, it should be understood that terms such as "include" or "have" are intended to designate that the features, numbers, steps, operations, components, parts, or combinations thereof described in the specification exist, but this does not preclude a possibility of addition or existence of one or more other features, numbers, steps, operations, components, parts, or combinations thereof.

Hereinafter, embodiments of the present disclosure will be described with reference to the accompanying drawings.

Figure 2:
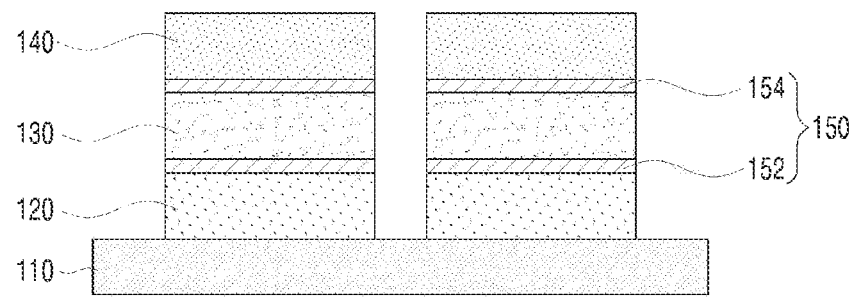
FIG. 2 is a sectional view taken along line I-I of FIG. 1.
Figure 3:
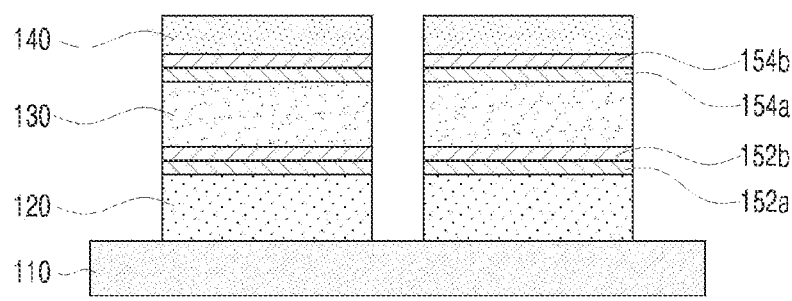
FIG. 3 is a view illustrating a MIM capacitor according to an embodiment of the present disclosure.

FIG. 1 is a view illustrating a MIM capacitor according to an embodiment of the present disclosure, FIG. 2 is a sectional view taken along line I-I of FIG. 1, and FIG. 3 is a view illustrating a MIM capacitor according to an embodiment of the present disclosure.

Prior to the description of the drawings, in the MIM capacitor according to the embodiment of the present disclosure, a 'thickness direction' may be used as the same concept as a direction in which dielectric layers are stacked, that is, a 'deposition direction'.

Referring to the drawings, a MIM capacitor 10 according to an embodiment of the present disclosure may be formed by depositing a lower electrode 120, a dielectric layer 130, and an upper electrode 140 on a substrate 110.

As the substrate 110, a substrate having a structure of Pt/Ti/SiO2/Si may be used. In this case, when the substrate 110 is Pt, the substrate itself may function as a lower electrode. Alternatively, when the substrate 110 is Ti, it may function to improve adhesion to the lower electrode 120, and the thickness may be changed depending on conditions, but may be formed with a thickness of several nanometers or several tens of nanometers.

Both the lower electrode 120 and the upper electrode 140 may be formed of a metal material, and may be formed of any one of a material using a conductive paste formed of at least any one of a multi-element conductive material such as TiN and TaN, a noble metal material such as palladium (Pd) and a palladium-silver (Pd—Ag) alloy, nickel (Ni), and copper (Cu).

Referring the drawings again, the dielectric layer 130 of the MIM capacitor 10 according to the embodiment of the present disclosure may be implemented with a High-K material having a high dielectric constant. For example, the dielectric layer 130 may be implemented with any one of hafnium oxide (HfO2) and zirconium dioxide (ZrO2), and in the embodiment of the present disclosure, an example implemented with zirconium dioxide will be described.

A film 150 including a first film 152 and a second film 154 may be formed between the lower electrode 120/the upper electrode 140, and the dielectric layer 130. When depositing the dielectric layer 130, the High-K material may be deposited by ALD or CVD method. In this case, in an initial stage of depositing the dielectric layer, a film formed of a metal component among the dielectric layer components or a film of a metal-rich state may be deposited on the lower electrode 120. The deposited film may be referred to as the first film 152.

Specifically, the dielectric layer 130 may include a metal component. For example, when the dielectric layer is hafnium oxide (HfO2), the metal component may be Hf, and when the dielectric layer is zirconium dioxide (ZrO2), the metal component may be Zr. A layer deposited on the lower electrode 120 by filming a component formed of only a metal component of the dielectric layer may be referred to as the first film 152.

That is, if the dielectric layer is deposited on the lower electrode without depositing the first film 152, the oxygen component of the High-K material and the metal component of the lower electrode 120 may be combined to form an oxide-based film.

The first film 152 may be determined according to the component of the dielectric layer 130. For example, when the dielectric layer 130 is hafnium oxide (HfO2), the first film 152 may be formed of only the metal component of Hf. Otherwise, when the dielectric layer 130 is zirconium dioxide (ZrO2), the first film 152 may be formed of only a metal component of Zr. The first film 152 formed as described above prevents the dielectric layer 130 and the lower electrode 120 from being in contact with each other to block the combination of the oxygen component of the dielectric layer 130 and the metal component of the lower electrode 120.

Similarly, before depositing the upper electrode 140 on the dielectric layer 130, the second film 154 may be deposited.

The first and second layers 152 and 154 deposited in this way prevent formation of an oxide-based interface (film) between the upper/lower electrodes and the dielectric layer including the metal component.

The thickness of the formed first and second layers 152 and 154 may each be 0.3 nm to 0.8 nm, but the present disclosure is not limited the thickness of the first film 152 and the second film 154.

In addition, the first film 152 and the second film 154 may be deposited multiple times. As illustrated in FIG. 3, the first film 152 itself may be formed in a plurality of layers by depositing the first film 152 on the lower electrode 120 multiple times. Similarly, the second film 154 deposited on the dielectric layer 130 may be formed in a plurality of layers. As the first film 152 and the second film 154 are formed in a plurality of layers as described above, contact between the lower electrode 120/upper electrode 140 and the dielectric layer 130 may be prevented. That is, the film deposited as a plurality of layers blocks the contact between the dielectric layer 130 and the lower electrode 120, and the upper electrode 140 to prevent the generation of an oxide-based interface between the dielectric layer 130 and the electrode.

Meanwhile, when the first film 152 and the second film 154 are generated, the lower electrode 120/upper electrode 140 may be formed by adjusting the constituent components thereof during the deposition process of the lower electrode 120/upper electrode 140.

For example, the lower electrode 120 and the upper electrode 140 are formed of a conductive material and may be deposited by any one of physical vapor deposition (PVD), chemical vapor deposition (CVD), and atomic layer deposition (ALD).

In this way, the first film 152 is deposited between the lower electrode 120 and the dielectric layer 130, and the second film 154 is deposited between the dielectric layer 130 and the upper electrode 140, so that it is possible to prevent the formation of an oxide-based film by combining the metal component of the electrode containing metal and the oxygen component of the High-K dielectric layer containing oxygen during the fabricating process of the MIM capacitor.

The oxide-based film, which may be formed, may create a problem that may reduce the capacitor capacitance, increase the capacitor capacitance variance, or increase the leakage current. To solve this problem, it is possible to prevent the generation of a non-uniform intermediate oxide film at the interface of the lower electrode 120 and the dielectric layer 130, and the upper electrode 140 and the dielectric layer 130 by the first film 152 deposited between the lower electrode 120 and the dielectric layer 130, and the second film 154 deposited between the dielectric layer 130 and the upper electrode 140.

FIG. 4A, FIG. 4B, FIG. 4C, FIG. 4D, FIG. 4E and FIG. 4F are views illustrating a fabricating process of the MIM capacitor according to the embodiment of the present disclosure.

Referring to the drawing, the MIM capacitor 10 includes the lower electrode 120 and the upper electrode 140 forming the MIM capacitor 10, and may include the dielectric layer 130 deposited between the lower electrode 120 and the upper electrode 140.

In the MIM capacitor 10, after the lower electrode is applied, the High-K dielectric layer is applied on the lower electrode, and then the metal electrode may be applied to the High-K dielectric material. After the metal electrode is applied, a patterning operation of photolithography and dry etching may be performed, and the MIM capacitor may be fabricated by a process of separating the lower electrode and the upper electrode by the patterning operation.

Figure 4A:
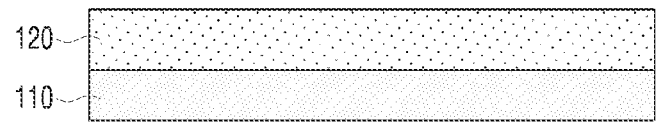
FIG. 4A, FIG. 4B, FIG. 4C, FIG. 4D, FIG. 4E and FIG. 4F are views illustrating a fabricating process of a MIM capacitor according to an embodiment of the present disclosure.

Looking at the fabricating process of the MIM capacitor 10 in detail, first, the substrate 110 may be deposited (FIG. 4A). A substrate having a structure of Pt/Ti/SiO2/Si may be used as the substrate 110, and the structure of the substrate 110 may be changed according to conditions.

The lower electrode 120 may be deposited on the formed substrate 110 (FIG. 4A). The deposited lower electrode 120 may be formed of a metal material and, for example, may be any one among one or more materials of a multi-element conductive material such as TiN and TaN, a noble metal material such as palladium (Pd) and a palladium-silver (Pd—Ag) alloy, nickel (Ni), and copper (Cu). Hereinafter, in the present disclosure, an example configured of the multi-element conductive material such as TiN and TaN will be described.

Figure 4B:
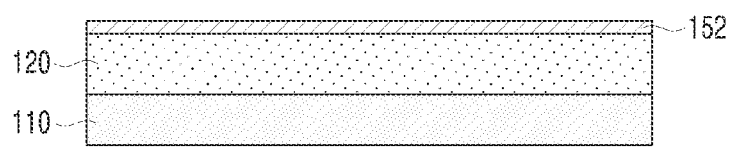

Thereafter, the first film 152 may be deposited on the lower electrode 120 (FIG. 4B). The deposited first film 152 may mean a film formed of a metal component among the dielectric layer components on the lower electrode 120 or a film of a metal-rich state in an initial deposition stage of depositing the dielectric layer 130 deposited on the lower electrode 120.

Figure 4C:
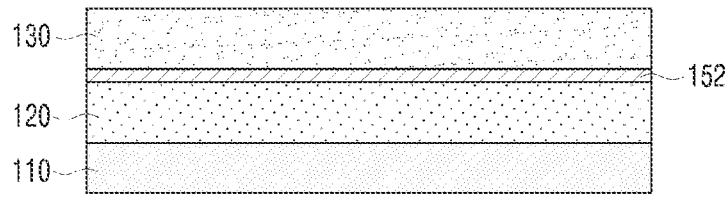

When the first film 152 is deposited, the dielectric layer 130 may be deposited (FIG. 4C). The dielectric layer 130 may be implemented with a High-K material having a high dielectric constant. For example, the dielectric layer 130 may be implemented with any one of hafnium oxide (HfO2) and zirconium dioxide (ZrO2), and in the embodiment of the present disclosure, an example implemented with zirconium dioxide will be described.

Figure 4D:
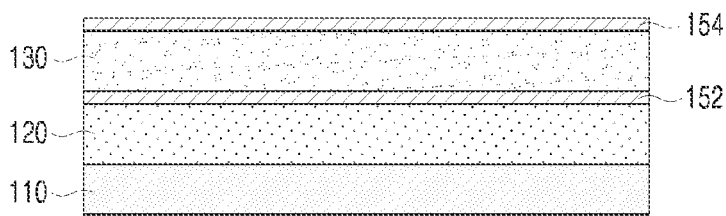

When the dielectric layer 130 is stacked, the second film 154 may be deposited on the dielectric layer 130 (FIG. 4D). The deposited second film 154 may perform a similar operation to that of the previously deposited first film 152.

Specifically, the dielectric layer 130 may include the metal component. For example, when the dielectric layer is hafnium oxide (HfO2), the metal component may be Hf, and when the dielectric layer is zirconium dioxide (ZrO2), the metal component may be Zr. A layer deposited on the lower electrode 120 by filming a component formed of only a metal component of the dielectric layer may be referred to as the first film 152, and a layer deposited on the dielectric layer 130 may be referred to the second film 154.

It is possible to prevent the formation of the oxide-based interface (film) between the lower electrode 120 and the dielectric layer 130, and between the upper electrode 140 and the dielectric layer 130 by the first film 152 and the second film 154 formed in this way.

Specifically, if the dielectric layer is deposited on the lower electrode without depositing the first film 152, the oxygen component of the High-K material and the metal component of the lower electrode 120 may combine to form an oxide-based film. Similarly, even when the upper electrode 140 is deposited on the dielectric layer 130, the oxygen component of the High-K material and the metal component of the upper electrode 140 may be combined to form the oxide-based film. The generated oxide-based film may cause problems that may reduce the capacitor capacitance, increase the capacitor capacitance variance, or increase the leakage current.

To minimize this, the first film 152 is deposited on the lower electrode 120 and the second film 154 is deposited on the dielectric layer 130. A method for depositing the first film 152 and the second film 154 may be implemented by the following method.

For example, the first film 152 and the second film 154 may be determined according to the component of the dielectric layer 130. For example, when the dielectric layer 130 is hafnium oxide (HfO2), the first film 152 and the second film 154 may be formed of only the metal component of Hf.

Here, in the process of depositing the first film 152, the first film 152 may be formed by depositing a layer formed of the metal component among components of the dielectric layer 130 between the lower electrode 120 and the dielectric layer 130 in an initial stage of depositing the dielectric layer 130. Similarly, the second film 154 may be formed by depositing a layer formed of the metal component among components of the dielectric layer 130 between the dielectric layer 130 and the upper electrode 140 before depositing the upper electrode 140 on the dielectric layer 130.

It is possible to prevent formation of the oxide-based interface layer between the dielectric layer 130 and the lower electrode 120, and the upper electrode 140 by the first film 152 and the second film 154 formed by the deposition as described above.

Figure 4E:
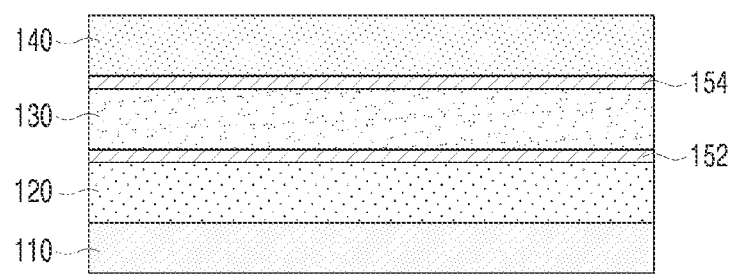
Figure 4F:
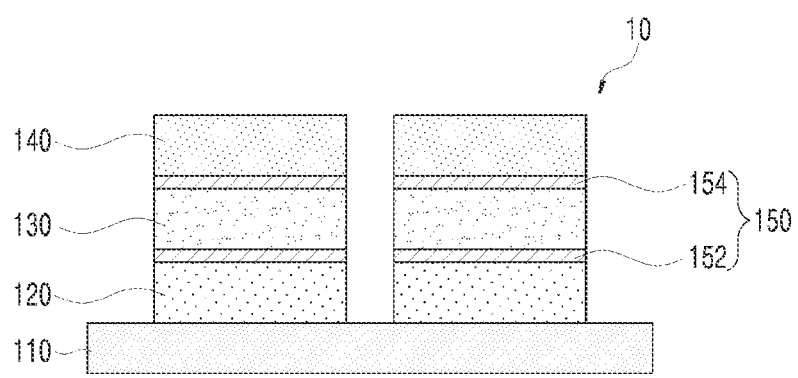
Figure 5:
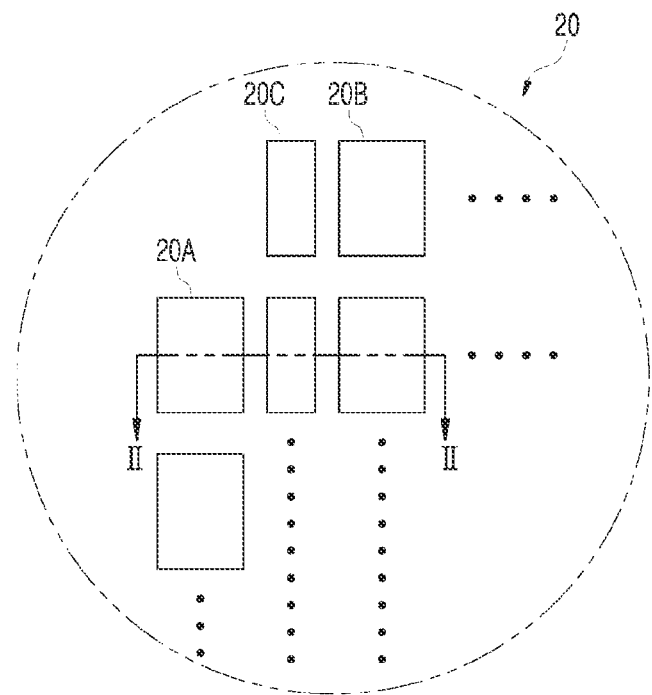
FIG. 5 is a view illustrating a multilayer silicon capacitor according to another embodiment of the present disclosure.

When the second film 154 is deposited on the dielectric layer 130 as described above, the upper electrode 140 is deposited on the second film 154, and then the MIM capacitor may be formed through exposure, etching, or the like. (FIGS. 4E and 4F).

As described above, in the MIM capacitor according to the embodiment of the present disclosure, the performance of the capacitor may be maximized by using the dielectric layer formed of the High-K material having a large dielectric constant. As the dielectric layer is formed of the High-K material, an oxygen-based film may be formed between the lower electrode 120/the upper electrode 140 and the dielectric layer 130 formed of the metal component. To prevent this, the first film 152 is deposited between the lower electrode 120 and the dielectric layer 130, and the second film 154 is deposited between the dielectric layer 130 and the upper electrode 140. The oxygen component of the dielectric layer 130 and the metal component of the lower electrode 120 and the upper electrode 140 are combined by the deposited first and second films 152 and 154 to prevent the formation of the oxygen-based layer between the lower electrode 120 and the dielectric layer 130, and between the dielectric layer 130 and the upper electrode 140.

In addition, it is possible to prevent reducing the capacitor capacitance, increasing the capacitor capacitance variance, or generating the leakage current. In other words, it is possible to prevent the generation of an oxygen-based non-uniform interfacial layer between the dielectric layer of the High-K material and the electrode even during the thermal process when fabricating the MIM capacitor, thereby preventing deterioration of the performance of the capacitor.

Figure 6:
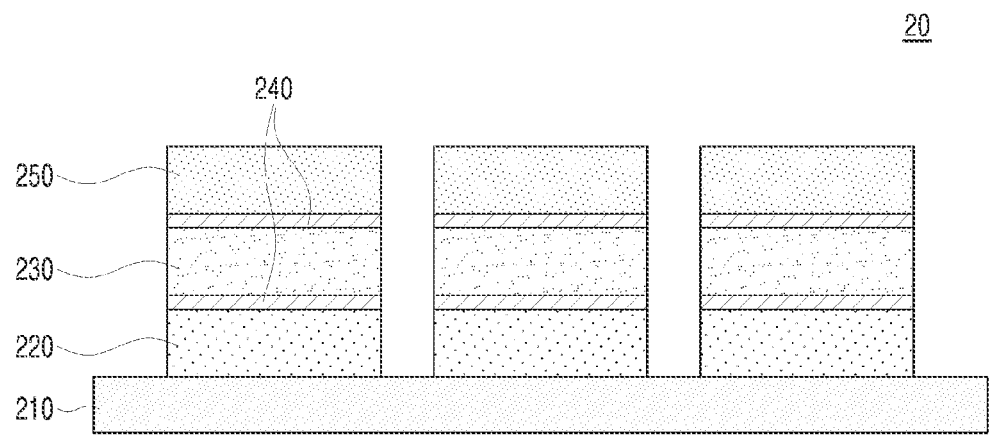
FIG. 6 is a sectional view taken along line II-II of FIG. 5.
Figure 7:
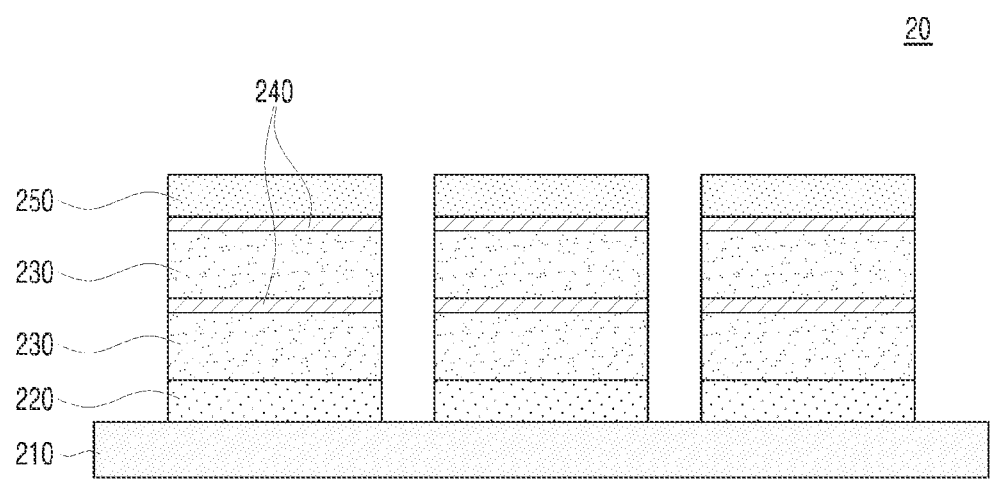
FIGS. 7 to 9 are views illustrating a multilayer silicon capacitor according to other embodiments of the present disclosure.

FIG. 6 is a view illustrating a multilayer silicon capacitor according to another embodiment of the present disclosure, and FIG. 7 is a sectional view taken along line II-II of FIG. 6.

Referring to the drawings, a multilayer silicon capacitor 20 according to the embodiment of the present disclosure may include a first electrodes 220 and a second electrodes 250 interposed between the dielectric layers 230 and 240, and the dielectric layers 230 and 240 to face each other.

The dielectric layers 230 and 240 may be formed by stacking dielectric layers having different dielectric constants. For example, the dielectric layers 230 and 240 may be configured to include the first dielectric layer 230 and the second dielectric layer 240 having different dielectric constants. Hereinafter, the dielectric layers 230 and 240 will be described in detail.

Meanwhile, in the multilayer silicon capacitor according to the embodiment of the present disclosure, the 'thickness direction' may be used as the same concept as the direction in which the dielectric layers are stacked, that is, the 'stacking direction'.

The type and configuration of the first electrode 220 and the second electrode 250 of the silicon capacitor 20 are not particularly limited, and for example, may be formed by using a conductive paste formed of one or more materials of noble metals such as palladium (Pd) and palladium-silver (Pd—Ag) alloy, nickel (Ni), and copper (Cu).

An external electrode may be installed outside the silicon capacitor 20 to form an electrostatic capacitance, and the external electrode may be electrically connected to the first electrode 220 and the second electrode 250 of the silicon capacitor 20.

The external electrode may be formed of a conductive material of the same material as those of the first electrode 220 and the second electrode 250, and may be formed by applying a conductive paste and then sintering.

Meanwhile, the dielectric layers 230 and 240 of the multilayer silicon capacitor 20 according to the embodiment of the present disclosure may have a total thickness of 18 nm to 20 nm. The thickness of the dielectric layers 230 and 240 may mean an average thickness of the dielectric layers 230 and 240 disposed between the first electrode 220 and the second electrode 250 inside the silicon capacitor 20.

The average thickness of the dielectric layers 230 and 240 may be measured by scanning an image of a longitudinal cross-section of the silicon capacitor 20 as illustrated in FIG. 7. For example, as illustrated in FIG. 6, for an arbitrary dielectric layer extracted from an image scanned in a length and a cross-section in the thickness direction (II-II) cut from the central portion of the silicon capacitor 20 in the width direction, the thickness is measured in the length direction. Thus, the average value may be measured.

Referring the drawings again, as described above, the dielectric layers 230 and 240 may be configured to include the first dielectric layer 230 and the second dielectric layer 240 having different dielectric constants. In the embodiment of the present disclosure, an example in which the dielectric layers 230 and 240 are configured of first and second dielectric layers is described, but three or more dielectric layers having different dielectric constants may be sequentially stacked.

In this case, the first dielectric layer 230 may be implemented with the High-K material having a high dielectric constant, and the second dielectric layer 240 may be implemented with the material having a lower dielectric constant than that of the first dielectric layer 230.

For example, the first dielectric layer 230 may be implemented with any one of hafnium oxide (HfO2) and zirconium dioxide (ZrO2), and in the embodiment of the present disclosure, an example implemented with zirconium dioxide will be described.

As described above, the second dielectric layer 240 may be implemented with a material (dielectric material or High-K material) having a lower dielectric constant than that of the first dielectric layer 230, and may be generally formed of a material forming the dielectric layer.

In the dielectric layers 230 and 240, the first dielectric layer 230 and the second dielectric layer 240 may be sequentially stacked alternately. For example, as illustrated in FIG. 7, after the first dielectric layer 230 is stacked on the first electrode 220 and the second dielectric layer 240 is stacked on the first dielectric layer 230, another dielectric layer which has the same material as the material of the first dielectric layer 230 may be stacked on the second dielectric layer 240. Also, another dielectric layer which has the same material as the material of the second dielectric layer 240 may be stacked on another dielectric layer which has the same material as the material of the first dielectric layer 230, and the second electrode 250 may be formed on another dielectric layer which has the same material as the material of the second dielectric layer 240. The stacking order of the dielectric layers may be changed, and the present disclosure is not limited to the stacking order of the dielectric layers.

In this case, as the characteristics of the stacked dielectric layers 230 and 240, the first dielectric layer 230 may be formed to be thicker than the second dielectric layer 240. This is to minimize a change in the characteristics of the capacitor in the high frequency and/or ultrahigh frequency (hereinafter limited to the ultrahigh frequency) region by the first dielectric layer 230 formed of the High-K material.

That is, zirconium dioxide or hafnium oxide may be used as usually described as the High-K material. In the case of zirconium dioxide, it may be combined with Poly-Si, and when being combined, SiO2 may be generated. The SiO2 generated in this way reduces the dielectric constant of the capacitor, and has a limitation of deteriorating the electrical characteristics of the device.

In order to solve this problem, the thickness of the first dielectric layer 230 formed of the High-K material is formed to be thicker than that of the second dielectric layer 240 so that the characteristics of the capacitor of the High-K material are maintained. The second dielectric layer 240 having a lower dielectric constant than that of the first dielectric layer 230 is stacked in order to solve limitations such as a decrease in the dielectric constant of the capacitor formed of the High-K material and a change in characteristics. Accordingly, it is possible to maintain the characteristics of the dielectric layer formed of the High-K material with a relatively higher dielectric constant to implement a thin and high-capacitance capacitor, and to prevent the change in the characteristics of the High-K material with a relatively higher dielectric constant at the ultrahigh frequency.

That is, when the first dielectric layer 230 is stacked, it may be stacked as much as a thickness where the change in the material characteristics is minimized at the ultrahigh frequency. For example, when the first dielectric layer 230 is stacked, a thickness to be stacked at a time may be limited.

For example, the thickness of the first dielectric layer 230 stacked at a time may be 5 nm to 6 nm. Alternatively, the thickness of the second dielectric layer 240 to prevent a change in characteristics of the first dielectric layer 230 implemented with the High-K material at the ultrahigh frequency may be 1 nm to 3 nm. The thickness of the first dielectric layer 230 and the second dielectric layer 240 may be changed according to conditions, and the present disclosure is not limited by the thickness of the dielectric layer.

Meanwhile, the first dielectric layer 230 and the second dielectric layer 240 formed of the dielectric layers may be alternately stacked. In this way, when the dielectric layer is formed, the dielectric layer is not formed by using only the first dielectric layer 230 formed of the High-K material with a relatively higher dielectric constant, and the second dielectric layer 240 having a lower dielectric constant than that of the first dielectric layer 230 is stacked between the first dielectric layers 230. Therefore, the second dielectric layer 240 may compensate for the change in the dielectric characteristics of the first dielectric layer 230 when the capacitor is operated.

Specifically, when the dielectric layer is formed by using only the second dielectric layer 240 having a low dielectric constant, the area of the capacitor must be increased or the thickness of the capacitor must be reduced. However, when the area of the capacitor is increased, there is a limitation in that the length and the width thereof are relatively increased because the storage capacitance must be increased.

On the other hand, since the High-K material with higher dielectric constant may have a higher charge storage capacitance even with a smaller area, the charge storage efficiency may be increased without increasing the area of the capacitor. In addition, since the dielectric layers 230 and 240 are not formed of only the High-K material with higher dielectric constant, it is possible to prevent deterioration of the electrical characteristics of the silicon capacitor 20 by minimizing the change in the characteristics of the dielectric layers 230 and 240 at the ultrahigh frequency.

In addition, as described above, as the dielectric layer is formed of the High-K material with a relatively higher dielectric constant, it may be implemented as a capacitor having a thinner and higher capacitance than the capacitor formed of only the dielectric layer having the lower dielectric constant. That is, as in the embodiment of the present disclosure, the first dielectric layer 230 formed of the High-K material with a relatively higher dielectric constant and the second dielectric layer 240 having the lower dielectric constant are alternately stacked to form the dielectric layer while maintaining the performance of the thin, high-capacitance capacitor.

As described above, in order to increase the capacitance of the capacitor, the High-K having a large dielectric constant must be used to obtain a desired capacitor capacitance. However, in order to prevent a decrease in capacitor capacitance and capacitor performance degradation at the ultrahigh frequency, the capacitor may be formed by sequentially stacking the first dielectric layer 230 and the second dielectric layer 240 as in the embodiment of the present disclosure. In this case, when the thickness of the second dielectric layer 240 with lower dielectric constant increases, the efficiency of the capacitor may decrease, and thus, the second dielectric layer 240 may be stacked thinner than the first dielectric layer 230. That is, the thickness of the second dielectric layer 240 is limited so that the entire thickness of the dielectric layer is not increased, and a capacitor capacitance loss and a capacitor efficiency decrease may be minimized with the thickness limitation of the second dielectric layer 240.

In conclusion, when the second dielectric layer 240 having a smaller dielectric constant than that of the first dielectric layer 230 is stacked with the first dielectric layer 230 to form the capacitor, it is possible to improve the degradation in the dielectric characteristics at the ultrahigh frequency, Leakage current increase, or the like that may occur in the first dielectric layer 230 alone structure. In addition, while forming the capacitor by stacking dielectric layers having different dielectric constants, a breakdown voltage (BV) may be improved.

Figure 8:
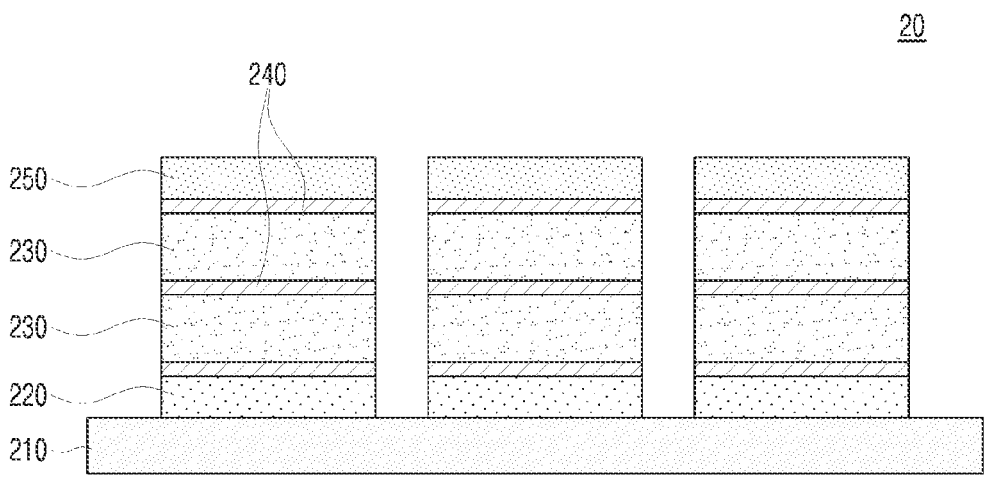
Figure 9:
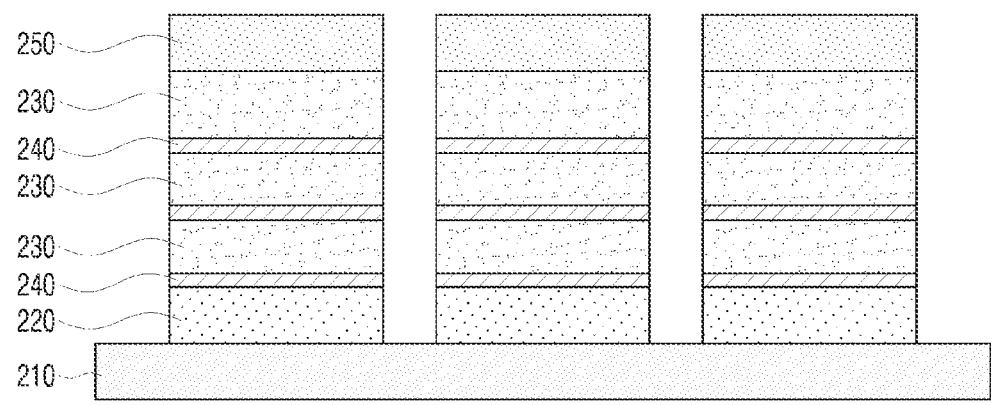

FIGS. 7 to 9 are views illustrating multilayer silicon capacitors according to other embodiments of the present disclosure (which may be referred to as first to third embodiments).

The first dielectric layer 230 of the multilayer silicon capacitor 20 according to the other first to third embodiments of the present disclosure may be in contact with one surface of at least any one of the first electrode 220 and the second electrode 250.

Specifically, referring to FIG. 7, the first dielectric layer 230 may be stacked on the first electrode 220. When the first dielectric layer 230 is stacked, the second dielectric layer 240 may be sequentially stacked on the first dielectric layer 230. The first dielectric layer 230 may be stacked on the second dielectric layer 240 stacked on the first dielectric layer 230, and the multilayer silicon capacitor 20 may be formed on the first dielectric layer 230 in the process of disposing the second electrode 250.

Alternatively, referring to FIGS. 8 and 9, the second dielectric layer 240 is stacked on the first electrode 220, and the first dielectric layer 230 and the second dielectric layer 240 may be stacked on the stacked second dielectric layer 240 sequentially and repeatedly a plurality of times. In this case, the first dielectric layer 230 may be stacked between the second dielectric layers 240 disposed up and down the first dielectric layer 230, and alternatively, may be stacked between the first electrodes 220 and the second dielectric layer 240.

The number of times the first dielectric layer 230 and the second dielectric layer 240 are stacked may be changed according to the conditions of the present disclosure, and even if the first and second dielectric layers are stacked a plurality of times, it is preferable that the overall thickness of the dielectric layers 230 and 240 is not changed.

FIG. 10A, FIG. 10B, FIG. 10C, FIG. 10D, FIG. 10E and FIG. 10F are views illustrating a fabricating process of the multilayer silicon capacitor according to an embodiment of the present disclosure.

Referring to the drawing, the multilayer silicon capacitor 20 may include a dielectric layer formed by stacking the internal electrode, the external electrode, and the internal electrode with each other which form the multilayer silicon capacitor 20.

Figure 10A:
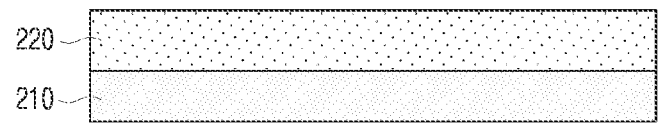
FIG. 10A, FIG. 10B, FIG. 10C, FIG. 10D, FIG. 10E and FIG. 10F are views illustrating a fabricating process of a multilayer silicon capacitor according to another embodiment of the present disclosure.
Figure 10B:
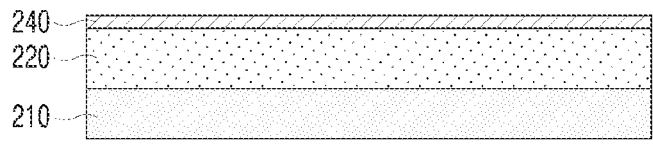
Figure 10C:
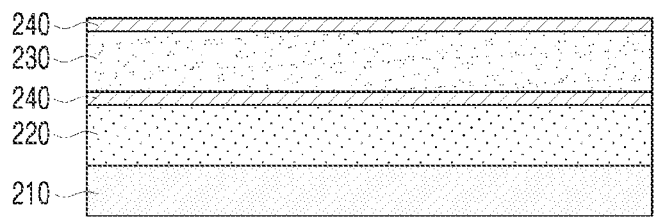
Figure 10D:
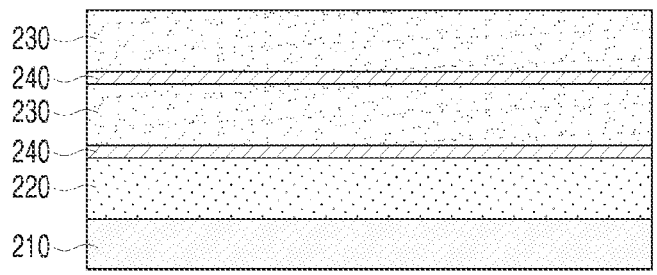
Figure 10E:
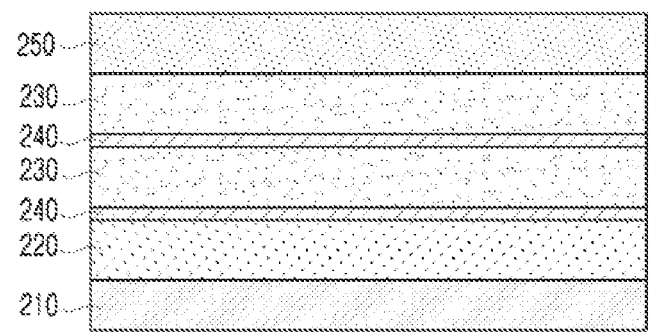
Figure 10F:
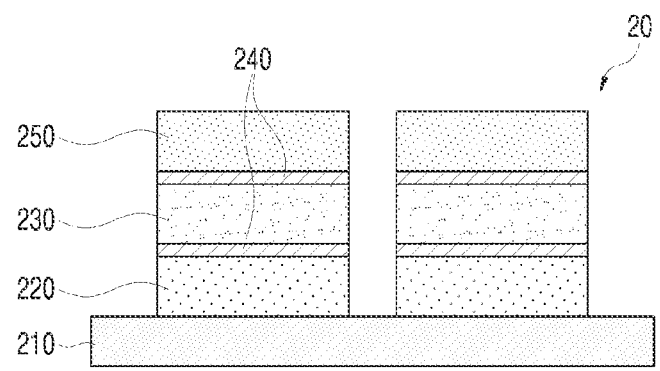

Looking specifically at the fabricating process of the multilayer silicon capacitor 20, the first electrode 220 may be stacked on the substrate 210, the first dielectric layer 230 be formed on the first electrode 220, and the second dielectric layer 240 having a different dielectric constant from that of the formed first dielectric layer 230 be stacked on the first dielectric layer 230 (see FIGS. 10A and 10B).

Since the stacked first and second dielectric layers 230 and 240 are very thin (for example, the thickness of the first dielectric layer 230 is 5 nm to less than 6 nm, and the thickness of the second dielectric layer 240 is 1 nm to less than 3 nm), the dielectric layers 230 and 240 may be deposited on the silicon capacitor by using an atomic layer deposition (ALD) method.

The atomic layer deposition has characteristics in that ultra-fine interlayer deposition may be performed by any one of the nano-thin layer deposition technologies, and deposition may be performed at a lower temperature (for example, less than 500 degrees) than that for chemical vapor deposition (CVD).

As described above, the first dielectric layer 230 may be implemented with a High-K material having a high dielectric constant, and the second dielectric layer 240 may be implemented with a material having a lower dielectric constant than that of the first dielectric layer 230.

For example, the first dielectric layer 230 may be implemented with any one of hafnium oxide (HfO2) and zirconium dioxide (ZrO2), and in the embodiment of the present disclosure, an example implemented with zirconium dioxide will be described. In addition, the High-K dielectric for forming the first dielectric layer 230 according to the embodiment of the present disclosure is a new material which is used when fabricating a gate or capacitor of a semiconductor.

As described above, the second dielectric layer 240 may be implemented with a material (dielectric material or High-K material) having a lower dielectric constant than that of the first dielectric layer 230, and may be generally formed of a material forming the dielectric layer.

In this case, the first dielectric layer 230 and the second dielectric layer 240 may be alternately stacked. For example, after the second dielectric layer 240 is stacked on the first electrode 220 and the first dielectric layer 230 is stacked on the second dielectric layer 240, the second dielectric layer 240 is stacked on the first dielectric layer 230, and then the second electrode 250 is stacked on the second dielectric layer 240 to form the capacitor (see FIGS. 10C, 10D, 10E, and 10F). Here, the stacking order of the dielectric layers may be changed, and the present disclosure is not limited to the stacking order of the dielectric layers.

Meanwhile, the thickness of the first dielectric layer 230 may be thicker than that of the second dielectric layer 240. Specifically, the second dielectric layer 240 may be stacked on one surface of the first dielectric layer 230, and the stacked second dielectric layer 240 may have a thickness smaller than that of the first dielectric layer 230. The second dielectric layer 240 stacked in this way may compensate for the change in the characteristics of the first dielectric layer 130 formed of the High-K material with a relatively higher dielectric constant in the ultrahigh frequency region.

As described above, the first dielectric layer 230 may be formed of the High-K material having a high dielectric constant, and as described above, the High-K material with a relatively higher dielectric constant may be zirconium dioxide. In the case of such zirconium dioxide, it may be combined with Poly-Si, and when being combined, SiO2 may be generated. SiO2 generated in this way may reduce the dielectric constant of the capacitor and may deteriorate the electrical characteristics of the device.

To this end, the second dielectric layer 240 is thinly stacked to minimize a combination probability between zirconium dioxide and Poly-Si in case Poly-Si is used as electrodes, and as a result, it is possible to prevent a change in the characteristics of the first dielectric layer 230 at the ultrahigh frequency. That is, the thickness of each first dielectric layer 230 is sufficiently thick to maintain the characteristics of the High-K material which are characteristics of the entire dielectric layer, and the thickness of the second dielectric layer 240 stacked between the first dielectric layers 230 is limited. Thus, the limitation of the dielectric layer according to the second dielectric layer 240 may be minimized. In addition, the change in the characteristics of the first dielectric layer 230 is minimized by not forming the dielectric layer only with the first dielectric layer 230 having a high dielectric constant, but making the second dielectric layer 240 compensate for the limitation of the first dielectric layer 230.

In addition, by adding the second dielectric layer 240 to the first dielectric layer 230 to store the charge of the capacitor, the charge storage efficiency of the dielectric is prevented from being lowered, thereby preventing the capacitor capacitance and voltage efficiency from being lowered even at the ultrahigh frequency range.

As described above, in the multilayer silicon capacitor according to the embodiment of the present disclosure, the dielectric layer including the first dielectric layer and the second dielectric layer having different dielectric constants may be formed as the multi-layered dielectric layer.

Specifically, the first dielectric layer may be formed of the High-K material with a relatively higher dielectric constant, and the second dielectric layer may be formed of a material having a lower dielectric constant than that of the first dielectric layer. Accordingly, when the capacitor is fabricated, the dielectric layer, which is the High-K material with a relatively higher dielectric constant, is used, and thus the charge storage efficiency may be increased.

In addition, since the second dielectric layer is formed by using a material having a dielectric constant lower than that of the first dielectric layer, the change in electrical characteristics of the device at the ultrahigh frequency may be minimized.

That is, as a dielectric layer is formed by mixing a material having a low dielectric constant that has little influence on the ultrahigh frequency, it is possible to minimize the change in characteristics of the dielectric layer even at the ultrahigh frequency.

A stacked silicon capacitor according to another embodiment of the present disclosure includes a first electrode and a second electrode, and a dielectric layer formed of a first dielectric layer and a second dielectric layer disposed between the first electrode and the second electrode, and formed of a silicon dielectric material.

A dielectric constant of the first dielectric layer may be greater than a dielectric constant of the second dielectric layer, and a thickness of the first dielectric layer may be greater than a thickness of the second dielectric layer.

The first dielectric layer may be any one of hafnium oxide (HfO2) and zirconium dioxide (ZrO2).

The first dielectric layer may be formed at a thickness of 5 nm to 6 nm, the second dielectric layer may be formed at a thickness of 1 nm to 3 nm, and an overall thickness of the stacked dielectric layers may be formed to be 18 nm to 20 nm.

The first dielectric layer may be disposed to be in contact with one surface of any one of the first electrode and the second electrode.

The first dielectric layer may be disposed to be in contact with each one surface of the first electrode and the second electrode at the same time.

A method for fabricating a stacked silicon capacitor according to another embodiment of the present disclosure includes a step of forming a first electrode, a step of forming a first dielectric layer on the first electrode, a step of stacking a second electrode having a different dielectric constant from that of the first dielectric layer on the first dielectric layer, and a step of forming a second electrode on the second dielectric layer.

A dielectric constant of the first dielectric layer may be greater than a dielectric constant of the second dielectric layer, and the step of stacking the second dielectric layer may include a step of stacking the second dielectric layer on the first dielectric layer at a thickness smaller than that of the first dielectric layer.

In addition, the method for fabricating a stacked silicon capacitor according to another embodiment of the present disclosure may further include stacking the first dielectric layer on the second dielectric layer after stacking the second dielectric layer.

The description of the embodiments of the present disclosure described above is for illustration, and those of ordinary skill in the art to which the present disclosure pertains will be able to understand that the embodiments may be easily transformed into other specific forms without changing the technical spirit or essential features of the present disclosure. Therefore, it should be understood that the embodiments described above are illustrative in all respects and not restrictive. For example, each component described as a single type may be implemented in a dispersed form, and likewise components described as the distributed form may also be implemented in a combined form.

The scope of the present disclosure is indicated by the following claims rather than the above detailed description, and all changes or modifications derived from the meaning and scope of the claims and their equivalents should be construed as being included in the scope of the present disclosure.

What is claimed is:

1. A MIM (metal insulator metal) capacitor comprising:
a lower electrode formed of metal;
a first film deposited on the lower electrode;
a dielectric layer deposited on the first film;
a second film deposited on the dielectric layer; and
an upper electrode formed of metal on the second film,
wherein the first film and the second film are deposited with a film formed of a metal component of only hafnium or zirconium.

2. The capacitor of claim 1
wherein the first film and the second film are any one of hafnium (Hf) and zirconium (Zr).

3. The capacitor of claim 1
wherein the dielectric layer is a High-K dielectric implemented with any one of hafnium oxide (HfO2) and zirconium dioxide (ZrO2).

4. The capacitor of claim 1
wherein the first film and the second film are formed of a plurality of layers.

5. The capacitor of claim 1
wherein a thickness of the first film is 0.3 nm to 0.8 nm and a thickness of the second film is 0.3 nm to 0.8 nm.

6. The capacitor of claim 1
wherein the lower electrode and the upper electrode are formed of a conductive material and are deposited by any one of physical vapor deposition (PVD), chemical vapor deposition (CVD), and atomic layer deposition (ALD).

7. A method for fabricating a MIM capacitor, comprising:
a step of depositing a lower electrode formed of metal;
a step of depositing a first film on the lower electrode;
a step of depositing a dielectric layer on the first film;
a step of depositing a second film on the dielectric layer; and
a step of depositing an upper electrode formed of metal on the second film,
wherein the first film and the second film are deposited with a film formed of a metal component of only hafnium or zirconium.

8. The method for fabricating a capacitor of claim 7,
wherein in the step of depositing a dielectric layer, a High-K dielectric implemented with any one of hafnium oxide (HfO2) and zirconium dioxide (ZrO2) is deposited.

9. The method for fabricating a capacitor of claim 7,
wherein the step of forming the first film includes a step of depositing a plurality of layers on the lower electrode, and
wherein the step of forming the second film includes a step of depositing a plurality of layers on the dielectric layer.

10. A stacked silicon capacitor comprising:
a first electrode;
a second electrode;
a dielectric layer formed of a first dielectric layer and a second dielectric layer, disposed between the first electrode and the second electrode, and formed of a silicon dielectric material;
a first film deposited on the first electrode; and
a second film deposited on the dielectric layer,
wherein a dielectric constant of the first dielectric layer is greater than a dielectric constant of the second dielectric layer, and
wherein the first film and the second film are deposited with a film formed of a metal component of only hafnium or zirconium.

11. The stacked silicon capacitor of claim 10,
wherein the first dielectric layer is any one of hafnium oxide (HfO2) and zirconium dioxide (ZrO2).

12. The stacked silicon capacitor of claim 10,
wherein a thickness of the first dielectric layer is greater than a thickness of the second dielectric layer.

13. The stacked silicon capacitor of claim 12,
wherein the first dielectric layer is formed at a thickness of 5 nm to 6 nm, the second dielectric layer is formed at a thickness of 1 nm to 3 nm.

14. The stacked silicon capacitor of claim 10,
wherein an overall thickness of the first dielectric layer and the second dielectric layer disposed between the first electrode and the second electrode is formed at a thickness of 18 nm to 20 nm.

15. The stacked silicon capacitor of claim 10,
wherein the first dielectric layer is disposed to be in contact with one surface of any one electrode of the first electrode and the second electrode.

16. The stacked silicon capacitor of claim 10,
wherein the first dielectric layer is disposed to be in contact with each one surface of the first electrode and the second electrode at the same time.

17. A method for fabricating a stacked silicon capacitor, comprising:
forming a first electrode;
forming a first dielectric layer on the first electrode;
stacking a second dielectric layer having a different dielectric constant from that of the first dielectric layer on the first dielectric layer; and
forming a second electrode on the second dielectric layer,
wherein a dielectric constant of the first dielectric layer is greater than a dielectric constant of the second dielectric layer, and
wherein the first dielectric layer is formed at a thickness of 5 nm to 6 nm, the second dielectric layer is formed at a thickness of 1 nm to 3 nm.

18. The method for fabricating a stacked silicon capacitor of claim 17, further comprising:
   wherein stacking the second dielectric layer comprises stacking the second dielectric layer on the first dielectric layer, a thickness of the second dielectric layer being smaller than that of the first dielectric layer.

19. The method for fabricating a stacked silicon capacitor of claim 17, further comprising:
   stacking another dielectric layer having a material that is the same as a material of the first dielectric layer on the second dielectric layer after stacking the second dielectric layer.

* * * * *